United States Patent
Yanagawa (10) Patent No.: US 7,182,664 B2
(45) Date of Patent: Feb. 27, 2007

(54) METHOD AND AN APPARATUS FOR MANUFACTURING AN ORGANIC EL DISPLAY DEVICE

(75) Inventor: Katsuhiko Yanagawa, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 366 days.

(21) Appl. No.: 10/794,771

(22) Filed: Mar. 5, 2004

(65) Prior Publication Data
US 2004/0242115 A1    Dec. 2, 2004

(30) Foreign Application Priority Data
Mar. 12, 2003  (JP) .............................. 2003-067175

(51) Int. Cl.
*H01J 9/26* (2006.01)
(52) U.S. Cl. ...................................... 445/25
(58) Field of Classification Search .................. 445/25
See application file for complete search history.

(56) References Cited

U.S. PATENT DOCUMENTS

| | | | |
|---|---|---|---|
| 6,801,269 B2 * | 10/2004 | Matsumoto | 349/58 |
| 2001/0052752 A1 * | 12/2001 | Ghosh et al. | 313/512 |
| 2003/0178467 A1 * | 9/2003 | Lee et al. | 228/42 |
| 2004/0165140 A1 * | 8/2004 | Pokorny et al. | 349/187 |

FOREIGN PATENT DOCUMENTS

| | | |
|---|---|---|
| EP | 0 781 075 A | 9/1995 |
| EP | 1 437 777 A | 12/2003 |
| JP | 11-045778 * | 2/1999 |
| JP | 11-45778 A | 2/1999 |
| JP | 11-283739 A | 10/1999 |
| JP | 2000-68049 A | 3/2000 |
| JP | 2001-093664 * | 4/2001 |
| JP | 2001-93664 A | 4/2001 |
| JP | 2001-284043 A | 10/2001 |
| JP | 2002-229042 A | 8/2002 |
| JP | 2003-257622 A | 9/2003 |

OTHER PUBLICATIONS

Relevant portion of Japanese Office Action of corresponding Japanese Application 2003-067175.

* cited by examiner

*Primary Examiner*—Joseph Williams
*Assistant Examiner*—Bumsuk Won
(74) *Attorney, Agent, or Firm*—Rossi, Kimms & McDowell LLP (57) ABSTRACT

An organic EL light emitting device and a color conversion filter are placed in an environment in which concentrations of water and oxygen are controlled. A peripheral sealing agent with a ring shape is applied around the color conversion filter, and a filler material is applied over the color conversion filter and inside the peripheral sealing agent. The organic EL light emitting device and the color conversion filter are transferred into a vacuum chamber, which is then evacuated. The organic EL light emitting device and the color conversion filter are preliminarily aligned and then bonded to obtain an aggregate. The aggregate is removed to an environment in which concentrations of water and oxygen are controlled and pressure is at atmospheric pressure, and irradiated with ultraviolet radiation to cure the peripheral sealing agent. The method reduces manufacturing costs and prevents inclusion of water in the internal space.

6 Claims, 5 Drawing Sheets

METHOD AND AN APPARATUS FOR MANUFACTURING AN ORGANIC EL DISPLAY DEVICE

BACKGROUND OF THE INVENTION

The present invention relates a method and an apparatus for manufacturing organic EL display devices that exhibit high precision and excellent visibility. The organic EL display devices can be applied to display devices in a wide variety of equipment, including portable terminals and industrial instruments.

In recent years, both the speed of information communication and expansion of application area have rapidly increased. In these circumstances, a wide variety of display devices have been proposed to meet the requirements of portability and animation display, while exhibiting low power consumption, high speed response, and high precision.

In color display systems, a type of color display device has been devised that employs a driving system using thin film transistors (TFTs). In this system, the type of devices in which light is emitted from the side of the substrate having the TFTs cannot attain high aperture due to the intercepting effect of wiring parts. Accordingly, a so-called top emission type has recently been employed in which light is emitted from the side of the substrate opposite to that on which the TFTs are formed.

The possibility of providing an organic EL display device with high precision and high luminosity are being demonstrated with a combination of the top emission system and a color conversion system in which multi-color fluorescent light is emitted from each of fluorescent bodies separately distributed and absorbing excited light. See, for example, Japanese Unexamined Patent Application Publication Nos. H11-251059 and 2000-77191.

Figure 5:
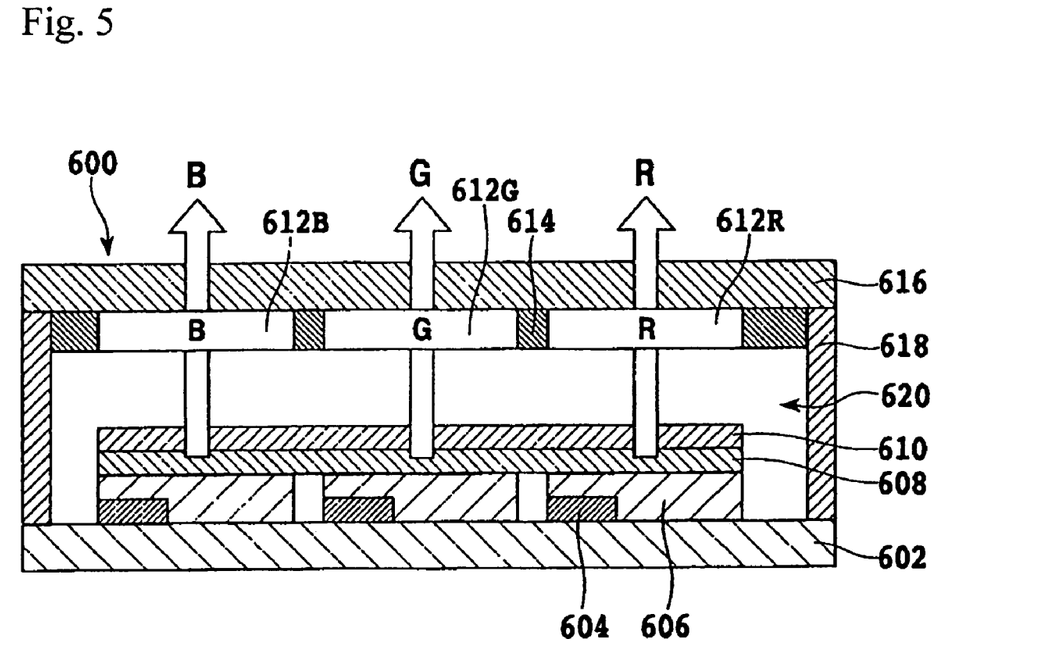
FIG. 5 is a schematic cross sectional view of a prior art organic EL display device 600.

FIG. 5 shows a schematic cross-sectional view of a structure of a prior art organic EL display. On substrate 602 are formed TFTs 604, bottom electrode 606, organic EL layer 608, and top electrode 610. On transparent substrate 616, color conversion filter layer 612 and black masks 614 are formed. Then, on the edges of the substrate 602, peripheral sealing layer 618 is formed using a two liquid type epoxy adhesive that cures at room temperature, for example. The peripheral sealing layer is bonded with transparent substrate 616. Internal space 620 is formed between the two substrates.

This structure has, however, a problem of degradation of light emission efficiency of the display device, because a part of the light emitted from organic EL layer 608 is reflected at the boundary between internal space 620 and top electrode 610 and/or at the boundary between internal space 620 and color conversion filter layer 612.

Japanese Unexamined Patent Application Publication No. H11-283739 proposes a way of suppressing reflection at the boundaries by filling the internal space with adhesive when the cover substrate is bonded to the organic EL light emitting device of top emission type. The cover substrate in this approach is intended only to seal an organic EL light emitting device. This document does not disclose provision of a color conversion filter layer on the cover substrate and does not mention alignment between a color conversion filter layer and an organic EL light emitting device.

Japanese Unexamined Patent Application Publication No. 2002-229042, on the other hand, discloses a process in which bonding and simultaneous alignment in a vacuum chamber is conducted in manufacturing process of liquid crystal display devices.

There is a need, therefore, to suppress reflection inside of the display device to improve light emitting efficiency in a display device made by bonding an organic EL light emitting device and a color conversion filter. In this context, it is important to avoid the generation of voids on the contact plane of the filler material with the organic EL light emitting device and/or with the color conversion filter, and to keep parallelism between the substrate of the organic EL light emitting device and the substrate of the color conversion filter by deformation of the filler material in the process of bonding during the process of filling the internal space with a filler material are. This is because reflection and refraction of light from the organic EL light emitting device occur at the voids, resulting in degradation of emission efficiency and display quality.

A method in which an opening for injecting filler material is provided in a bonding layer disposed in the periphery of either substrate, the two substrates are bonded, following which a filler material is injected through the opening and the opening is sealed off to provide an end seal would present additional problems. Such a method would require the additional steps of boring the opening in the bonding layer and end sealing, steps which would increase the cost.

Another possible method would be first to put a filler material on one of the substrates and then to pressure bond the organic EL light emitting device and the color conversion filter while aligning the two. However, air might enter during this process, causing bubble inclusion when the pressure bonding is conducted in the atmospheric pressure. Or alternatively, the pressure bonding would be conducted in a vacuum. Although the air causing bubble inclusion could be removed by conducting the pressure bonding in a vacuum, alignment in a vacuum requires complicated equipment and again raises production cost.

Therefore, a method is needed that fills the internal space between the organic EL light emitting device and the color conversion filter with a filler material without inclusion of bubbles, while at the same time facilitating alignment of the organic EL light emitting device and the color conversion filter.

Not only must air be prevented from entering the filler material, but also water inclusion should be avoided in the internal space between the organic EL light emitting device and the color conversion filter and in the filler material for filling the internal space. The water included in the internal space and/or the filler material diffuses into an organic light emitting layer of the organic EL light emitting device and generates spots incapable of light emission (so-called dark spots).

Therefore, a method is also needed that avoids this problem and prevents the water inclusion in the internal space and the filler material in the process of bonding the organic EL light emitting device and the color conversion filter.

SUMMARY OF THE INVENTION

It is therefore an object of the present invention to provide a method for manufacturing an organic EL display device that eliminates these problems.

According to a first aspect of the present invention a method is provided that comprises preparing an organic EL light emitting device comprising at least a first electrode, an organic EL layer, and a second electrode that are disposed over a first substrate; preparing a color conversion filter comprising at least a color conversion filter layer that is disposed over a second substrate; placing the organic EL light emitting device and the color conversion filter in a first environment in which concentrations of water and oxygen are controlled; applying a peripheral sealing agent with a ring shape around the color conversion filter; applying a filler material over the color conversion filter layer and inside the peripheral sealing agent; transferring the organic EL light emitting device and the color conversion filter into a vacuum chamber and evacuating the vacuum chamber; carrying out preliminary alignment of the organic EL light emitting device and the color conversion filter and bonding the organic EL light emitting device and the color conversion filter to obtain an aggregate; removing the aggregate to a second environment in which concentrations of water and oxygen are controlled and pressure is at atmospheric pressure; and irradiating ultraviolet radiation to the aggregate for curing the peripheral sealing agent in the environment in which concentrations or water and oxygen are controlled and pressure is at atmospheric pressure to obtain an organic EL display device.

In a preferred embodiment, the method of the invention further comprises performing a secondary alignment of the aggregate before the step of irradiating ultraviolet radiation to the aggregate.

In a further embodiment, the filler material has a surface tension that is larger than a surface tension of a surface of the color conversion filter.

In yet another embodiment, the first environment in which the concentrations of water and oxygen are controlled and the second environment in which concentrations of water and oxygen are controlled and pressure is at atmospheric pressure both contain water in an amount not greater than 50 ppm and oxygen in an amount not greater than 50 ppm.

The present invention also provides an apparatus for manufacturing an organic EL display device. This apparatus comprises means for transporting an organic EL light emitting device comprising at least a first electrode, an organic EL layer, and a second electrode that are disposed on a first substrate into an environment in which concentrations of water and oxygen are controlled; means for transporting a color conversion filter comprising at least a color conversion filter layer disposed over a second substrate into the environment in which contents of water and oxygen are controlled; means for applying a peripheral sealing agent around the color conversion filter; means for applying a filler material over the color conversion filter layer and inside the peripheral sealing agent; first means for transferring the organic EL light emitting device and the color conversion filter into a vacuum chamber; bonding means for carrying out preliminary alignment of the organic EL light emitting device and the color conversion filter and bonding the organic EL light emitting device and the color conversion filter to obtain an aggregate; second means for transferring the aggregate from the vacuum chamber to an environment in which concentrations of water and oxygen are controlled and pressure is at atmospheric pressure; and means for irradiating ultraviolet radiation to the aggregate for curing the peripheral sealing agent in the environment in which concentrations of water and oxygen are controlled and pressure is at atmospheric pressure.

Advantageously, the apparatus of the invention further comprises means for performing a secondary alignment of the aggregate in the environment in which concentrations of water and oxygen are controlled and pressure is at atmospheric pressure.

BRIEF DESCRIPTION OF THE DRAWINGS

FIG. 1(a) shows an organic EL light emitting device 160, FIG. 1(b) shows a color conversion filter 150, and FIG. 1(c) shows organic EL display device 140 made by bonding color conversion filter 150 and organic EL light emitting device 160.

DETAILED DESCRIPTION OF PREFERRED EMBODIMENTS

Figure 1A:
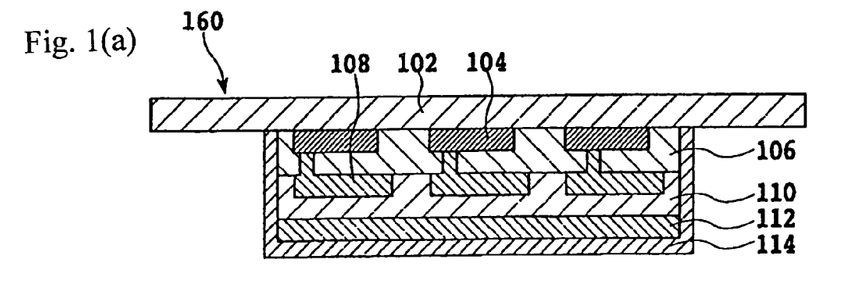
FIGS. 1(a)–(c) are schematic cross sectional views of an organic EL display device manufactured by a method of the present invention.
Figure 1B:
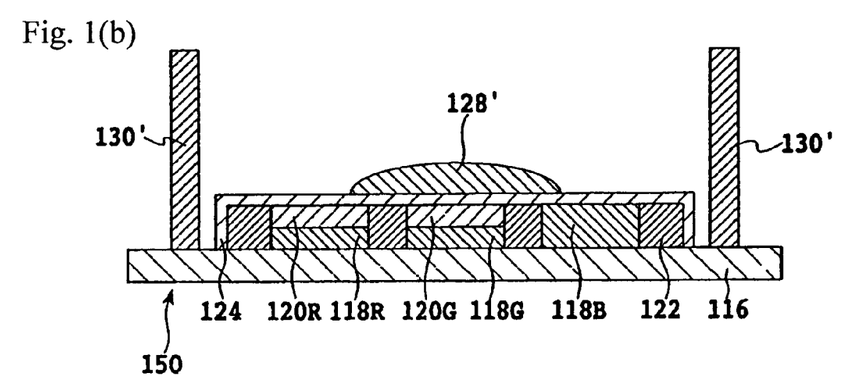
Figure 1C:
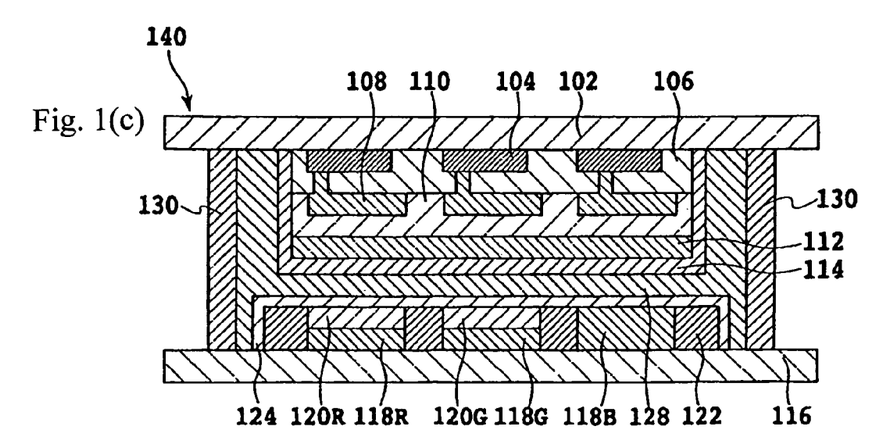

A structure and a manufacturing method of an organic EL display device according to the present invention will be described referring to FIG. 1. FIG. 1(a) shows a cross sectional view of an organic EL light emitting device 160. FIG. 1(b) shows a cross sectional view of a color conversion filter 150 applied with a peripheral sealing agent 130' and a filler material 128'. FIG. 1(c) shows a cross sectional view of an organic EL display device 140 made by combining the color conversion filter 150 and the organic EL light emitting device 160.

First substrate 102 according to the invention can be an insulative substrate of glass or plastics, or a substrate with an insulation thin film formed on a semiconductive or conductive substrate. Alternatively, first substrate 102 can be a flexible film formed of polyolefin, acrylic resin, polyester resin, or polyimide resin.

TFT 104 is a switching device for active-matrix driving. TFTs 104 are arranged in a matrix shape on first substrate 102. A source electrode or a drain electrode connects to first electrode 108 corresponding to each pixel. TFT 104 preferably is a bottom gate type having a gate electrode under a gate insulator film and uses a polycrystalline silicon film for an active layer.

A wiring part for a drain electrode and a gate electrode of TFT 104 and a structure of the TFT itself can be fabricated by a method known in the art to achieve the necessary withstand voltage, off-state current and on-state current performances. In the organic EL display device of the invention, which employs a top emission system, light does not pass through the TFT region. Accordingly, the TFT need not be restricted within a small area in order to enhance aperture. This allows for improved freedom in TFT design, and thus, is advantageous to achieve the above-mentioned performances.

Planarizing insulator film 106 preferably is provided on the TFTs 104, although it is not indispensable. Planarizing insulator film 106 is formed in a region excepting those places that are required by connection of first electrode 108 and the source electrode or the drain electrode of TFT 104, or connection of other circuits. The planarizing insulator film makes the substrate surface flat and facilitates any subsequent process of forming a precise pattern. Planarizing insulator film 106 can be formed of any appropriate material known in the art, and preferably is formed of inorganic oxide or nitride, or polyimide or acrylic resin.

First electrode 108 can be either an anode or a cathode. When the first electrode is an anode, a material having a large work function is used to efficiently inject holes. A conventional organic EL device, in which light is usually emitted through an anode, needs a transparent anode that is made of conductive metal oxide ITO, for example. Although a first electrode of an organic EL light emitting device of a top emission system need not necessarily be transparent, first electrode 108 can still be formed of a conductive metal oxide for example, ITO or IZO. A first electrode of a conductive metal oxide for example ITO, is preferably accompanied by a metallic electrode of Al, Ag, Mo, or W for example, exhibiting high reflectance under the first electrode. The metallic electrode, having lower resistivity than a conductive metal oxide, functions as an auxiliary electrode. In addition, the metallic electrode allows effective use of light generated in organic EL layer 110 by reflecting the light towards color conversion filter 150.

The first electrode, in the case of being a cathode, is composed of a material with a small work function, including alkali metals of lithium and sodium, alkaline earth metals of potassium, calcium, magnesium and strontium, electron injective metals of fluorides of these alkali metals or alkaline earth metals, and alloys or compounds of the alkali metals or alkaline earth metals. A metal electrode of Al, Mg, Mo or W of high reflectance can also be provided under the first electrode as a cathode as was described above for the anode, to attain low resistivity and effective use of emitting light from organic EL layer 110 by reflection.

In the case of active matrix driving by the TFTs as shown in FIG. 1(a), the first electrodes are formed on the planarizing insulator film 106 in an isolated form with each other corresponding to each of TFTs 104. Each first electrode connects to the source electrode or the drain electrode of each TFT 104. A first electrode connecting to the source electrode works as an anode, and a first electrode connecting to the drain electrode works as a cathode. First electrode 108 is connected to TFT 104 with a conductive plug filling a contact hole provided in the planarizing insulator film. The conductive plug can be formed integrally with first electrode 108, or formed with a low conductivity metal, such as gold, silver, copper, aluminum, molybdenum, or tungsten.

Organic EL layer 110 in an organic EL display device of a color conversion system according to the present invention emits light in the region of near ultraviolet to visible light, preferably in the blue to blue-green color region. The light in the region enters into the color conversion filter layer, which emits visible light with a desired color.

Organic EL layer 110 comprises at least an organic EL light emitting layer. The organic EL layer can also comprise, as necessary, a hole injection layer, a hole transport layer, an electron transport layer and/or electron injection layer. Specifically, the organic EL layer can take one of the following structures:

(1) An organic EL light emitting layer, (2) a hole injection layer/an organic EL light emitting layer, (3) an organic EL light emitting layer/an electron injection layer, (4) a hole injection layer/an organic EL light emitting layer/an electron injection layer, (5) a hole injection layer/a hole transport layer/an organic EL light emitting layer/an electron injection layer, and (6) a hole injection layer/a hole transport layer/an organic EL light emitting layer/an electron transport layer/an electron injection layer.

In the above structures, an anode connects to an organic EL light emitting layer or a hole injection layer, and a cathode connects to an organic EL light emitting layer or an electron injection layer.

A material for each of the above layers can be selected from known materials. To obtain a blue to blue-green color, the organic EL light emitting layer preferably contains a fluorescent whitening agent such as benzothiazole, benzoimidazole, or benzoxazole, a metal-chelated oxonium compound, a styrylbenzene compound, or an aromatic dimethylidine compound.

Second electrode 112 must efficiently inject electrons or holes into organic EL layer 110 and be transparent for the wavelength of the light emitted from organic EL layer 110. Second electrode 112 preferably exhibits a transmittance larger than about 50% for the light in the range of 400 to 800 nm.

When the second electrode is a cathode, the electrode material is required to have a small work function to efficiently inject electrons. In addition, the second electrode is necessarily transparent for the wavelength range of the light emitted from the organic EL layer. To retain compatibility of the two required properties, second electrode 112 preferably has a laminated structure composed of a plurality of layers, because a material with a small work function generally exhibits poor transparency. A layer in contact with organic EL layer 110 is a very thin film, less than 10 nm, of an alkali metal such as lithium or sodium, an alkaline earth metal such as sodium, calcium, magnesium, or strontium, an electron injective metal of a fluoride of these metals, or an alloy or a compound of one of these metals and another metal. Use of these materials having a small work function allows efficient electron injection, and the extremely small thickness suppresses deterioration of transparency due to the electrode material to the minimum. A transparent conductive film of ITO or IZO is formed on the extremely thin film. The conductive film works as an auxiliary electrode and reduces overall resistance of the second electrode 112 allowing supplying enough current to the organic EL layer 110.

In the case the second electrode is an anode, the material of the electrode necessarily has a large work function to enhance hole injection efficiency. The material must exhibit high transparency because the light emitted from organic EL layer 110 passes through the second electrode. Consequently, the material in this case is preferably a transparent conductive material such as ITO or IZO.

In an active matrix driven organic EL light emitting device as shown in FIG. 1(a), second electrode 112 can be formed as a sheet of homogeneous electrode without patterning.

Passivation layer 114 is provided to cover the thus formed second electrode 112 and the layers under the second electrode. Passivation layer 114 is effective for preventing transmission of oxygen, low molecular weight components, and moisture, and thus protects organic EL layer 110 from deterioration. Passivation layer 114 preferably is provided for these purposes, though it is not indispensable. Passivation layer 114 is preferably transparent for the wavelength range of the light from organic EL layer 110 since the light passes through the passivation layer towards a color conversion filter layer.

To meet these requirements, passivation layer 114 is composed of a material that (i) exhibits high transparency in the visible light range, that is, transmittance of more than about 50% in the range of 400 to 800 nm, (ii) is an electrical insulator, (iii) works as a barrier against moisture, oxygen, and low molecular weight components, and (iv) preferably has a film hardness of 2H or larger pencil hardness. Favored materials include inorganic oxides and inorganic nitrides such as SiOx, SiNx, SiNxOy, AlOx, TiOx, TaOx, and ZnOx. The passivation layer can be formed by any method commonly known in the art including a sputtering method, a CVD method, a vacuum deposition method, a dipping method, and a sol-gel method.

The passivation layer also can be composed of a variety of polymer materials including imide-modified silicone resin, (Japanese Unexamined Patent Application Publication Nos. H5-134112, H7-218717 and H7-306311), materials with inorganic metal oxide such as TiO, $Al_2O_3$, or $SiO_2$ dispersed in acrylic, polyimide or silicone resin (Japanese Unexamined Patent Application Publication Nos. H5-119306 and H7-104114), resin of acrylate monomer/oligomer/polymer having reactive vinyl group, resist resins (Japanese Unexamined Patent Application Publication Nos. H6-300910, H7-128519, H8-279394, and H9-330793), fluorine resins (Japanese Unexamined Patent Application Publication Nos. H9-330793 and H5-36475), and photo-curing resins and/or thermosetting resins such as epoxy resin having a mesogen structure with high thermal conductivity. There is no special restriction in applying these polymer materials. Commonly used dry application methods include sputtering, evaporation and CVD, while conventional wet methods include spin coating, roll coating and casting.

Passivation layer 114 can be a single layer or a lamination of layers. Thickness of passivation layer 114 is preferably in the range of about 0.1 to 10 µm, the thickness being a total thickness in the case of a lamination of layers.

Second substrate 116 is necessarily transparent for the light converted by a color conversion filter layer. Second substrate 116 must withstand environmental conditions such as solvents and temperature in the process for forming a color conversion filter layer and a black mask. The second substrate preferably exhibits good dimensional stability. Second substrate 116 preferably exhibits a transmittance of more than about 50% for the light with wavelength range of 400 to 800 nm.

Favored materials for second substrate 116 include glass, poly(ethylene terephthalate) resin, and poly(methyl methacrylate) resin. Polysilicate glass and blue sheet glass are particularly preferred. Second substrate 116 can be a flexible film composed of polyolefin, acrylic resin, polyester resin, or polyimide resin.

Color conversion filter layer as used herein is a general name for color filter layer 118, color conversion layer 120, and a lamination of color filter layer 118 and color conversion layer 120.

Color conversion layer 120 absorbs light in the near ultraviolet to visible light range, particularly blue to blue-green light, and converts wavelength distribution to visible light of the different wavelength. Color conversion layer 120 can be formed of a material containing color conversion dye of fluorescent or phosphorescent dye known in the art dispersed in a matrix resin. The matrix resin can be any appropriate resin known in the art.

Color filter layer 118 can be formed of a material containing a dye known in the art dispersed in a matrix resin. An example of such a material is a color filter material for liquid crystal display.

To obtain full color display, at least three color conversion filter layers are desired to be provided: a blue color (B) conversion filter layer, a green color (G) conversion filter layer, and a red color (R) conversion filter layer.

The red color conversion filter layer is preferably a lamination of a red color conversion layer and a red color filter layer. A reason for the lamination structure is as follows. When a light source is organic EL layer 110 that emits light in the blue to blue-green color range and the light from organic EL layer 110 is passed only through a simple red color filter to obtain light in a red color region, the output light is very dark since the light from the source contains only a minimal component in the wavelength range of red color. Output light becomes enough intense red color light by wavelength distribution conversion in a red color conversion layer from the light in the range of blue to blue-green to the light in the range of red color light. Thickness of the red color conversion layer 120R preferably is more than about 5 µm, and more preferably in the range of about 8 to 15 µm. Thickness of red color filter layer 118R is preferably in the range of about 1 to 1.5 µm.

A green color conversion filter layer preferably is a lamination of a green color conversion layer and a green color filter layer. If the light emitted from organic EL layer 110 contains green color component with enough intensity, only a green color filter may be used. The thickness of the green color conversion layer 120 is larger than 5 µm, and preferably in the range of about 8 to 15 µm. In the case of a lamination of a green color conversion layer and a green color filter layer, the thickness of green color filter layer 118G preferably is in the range of about 1 to 1.5 µm. When only green color filter layer 118G is used, thickness of the layer preferably is in the range of about 0.5 to 10 µm.

A blue color conversion filter layer may include a blue color filter layer and a blue color conversion layer that converts wavelength distribution of ultraviolet light or blue-green light emitted from organic EL layer 110 and outputs blue light. When organic EL layer 110 emits blue to blue-green light, only a blue color filter layer preferably is used. When only blue color filter layer 118B is used, thickness of the layer preferably is in the range of about 0.5 to 10 µm.

When organic EL layer 110 emits white light, desired colors can be obtained through only color filters for the colors. Nevertheless, use of color conversion layers for the colors can provide light of three primary colors with higher efficiency than use of only color filter layers.

Color conversion dyes used in the present invention may be kneaded with polymethacrylate, poly(vinyl chloride), copolymer resin of vinyl chloride-vinyl acetate, alkyd resin, aromatic sulfonamide resin, urea resin, melamine resin, benzoguanamine resin, or a mixture of some of these resins, to make pigments. As used herein, the term "color conversion dye" encompasses either a color conversion dye or a color conversion pigment. The color conversion dye or the color conversion pigment can be used alone or in combination of two or more types for the purpose of adjusting hue.

A color conversion layer of the invention contains an organic fluorescent dye in an amount preferably in the range of about 0.01 to 5 wt %, more preferably in the range of about 0.1 to 2 wt % with respect to the mass of the conversion layer. By using the organic fluorescent dye in the content of that range, satisfactory wavelength conversion can be performed without decrease of color conversion efficiency due to the effect of concentration quenching.

The form of the color conversion filter layer can be a stripe pattern separated with each color as is well known, or alternatively, may has a structure with sub pixels separated each other for each pixel.

Black mask 122 preferably is provided at every region between the color conversion filter layers corresponding to each color. Provision of the black mask prevents light from leaking to the color conversion filter layer of a neighboring sub pixel and makes fluorescent conversion color available that is satisfactory and free of blur. The black mask also may be provided around the site of the color conversion filter layer on second substrate 116, as long as adhesion of an organic EL light emitting device is not disturbed. Black mask 122 preferably has a thickness in the range of about 0.5 to 2.0 µm.

Overcoat layer 124 covering the color conversion filter layer is formed without deteriorating performance of the color conversion filter layer. It is formed of a material having proper elasticity. A preferred material for the layer is a polymer that (i) has surface hardness of 2H or more pencil hardness, (ii) has a Young's modulus of more than 0.3 MPa, (iii) allows formation of a smooth film on the color conversion filter layer, and (iv) does not deteriorate performance of color conversion layer 120. It is further preferred that the polymer material exhibit high transparency in a range of visible light (transmittance higher than about 50% in the range of 400 to 800 nm), be electrically insulative, and function as a barrier against moisture, oxygen, and low molecular weight components. It is advantageous to provide overcoat layer 124 for the above mentioned purposes, though not indispensable.

Examples of such polymer materials include imide-modified silicone resin (Japanese Unexamined Patent Application Publication Nos. H5-134112, H7-218717 and H7-306311), materials with inorganic metal oxide such as $TiO$, $Al_2O_3$, or $SiO_2$ dispersed in acrylic, polyimide or silicone resin (Japanese Unexamined Patent Application Publication Nos. H5-119306 and H7-104114), resin of acrylate monomer/oligomer/polymer having reactive vinyl group, resist resins (Japanese Unexamined Patent Application Publication Nos. H6-300910, H7-128519, H8-279394 and H9-330793), fluorine resins (Japanese Unexamined Patent Application Publication Nos. H9-330793 and H5-36475), and photo-curing resins and/or thermosetting resins such as epoxy resin having a mesogen structure with high thermal conductivity. There is no special restriction in applying these polymer materials to form overcoat layer 124. Commonly used dry application methods include sputtering, evaporation and CVD, while commonly used methods include spin coating, roll coating and casting.

Overcoat layer 124 can have a thickness in the range of about 1 to 10 µm. When overcoat layer 124 is formed by a casting method or a spin coating method, the layer preferably has a thickness in the range of about 3 to 5 µm.

Peripheral sealing layer 130 bonds organic EL light emitting device 160 and color conversion filter 150 together. The peripheral sealing layer preferably works to protect internal constituent elements against oxygen and moisture in the external environment. A peripheral sealing agent 130' for making peripheral sealing layer 130 should not vary in viscosity and should not to begin gelation before curing the agent is initiated. This property allows relative movement of organic EL light emitting device 160 and color conversion filter 150, thereby facilitating precise alignment of the color conversion filter and the light emitting part of the organic EL light emitting device.

A preferred peripheral sealing agent 130' in the present invention is an ultraviolet-radiation-curing type adhesive. Particularly preferred is an ultraviolet-radiation-curing type adhesive that cures in 10 to 60 seconds by irradiation of ultraviolet radiation with energy density of 100 $mW/cm^2$, to form peripheral sealing layer 130. Curing within the above-specified time avoids adverse effects on the other constituent elements due to the ultraviolet radiation and sufficiently cures the ultraviolet-radiation-curing type adhesive to obtain a peripheral sealing layer 130 that has proper bonding strength. Adhesives having a cure rat within the specified range are preferable from the viewpoint of efficiency of production process.

A peripheral sealing agent 130' may contain glass beads or silica beads having a diameter in the range of about 5 to 50 µm, preferably in the range of about 5 to 20 µm. The beads regulate the inter-substrate distance between first substrate 102 and second substrate 116 and the thickness of filler layer 128 in the process of bonding organic EL light emitting device 160 and color conversion filter 150. The beads bear the pressure applied for bonding. The beads also bear stress due to operation of the display, in particular, stress in the peripheral portion of the display, and are effective for avoiding degradation of the display due to the stress.

Filler layer 128 is made of a filler material 128'. The latter should be an inactive substance that does not adversely affect the performances of the organic EL light emitting device and the color conversion filter. The filler material 128' is allowed to cure or increase viscosity due to stimulus such as UV, visible light, or heat after pressured adhesion. The curing or viscosity increase of filler layer 128 that fills the internal space after the pressured adhesion makes the structure of the obtained display device stable.

The filler material 128' in the present invention preferably has a surface tension larger than a surface tension of the material to which it is applied, for example, an overcoat layer or a color conversion filter layer. Use of a filler material with such a surface tension prevents the filler material from spreading to the whole space to be applied after a process of application using a dispenser, for example. Thus, handling quality can be improved. The filler material in the present invention preferably has a surface tension larger than 0.030 N/m.

The filler material 128' needs to have a proper viscosity to form a filler layer 128 so that the filler material spreads to the whole internal space to be filled on application of pressure in the preliminary adhesion process without any damage to the color conversion filter or the organic EL light emitting device. The filler material in the present invention preferably has a viscosity in the range of about 0.05 to 5 Pa-s. The filler material also preferably has an elasticity value in the range of about 0.5 to 5 MPa. The filler material having such elasticity prevents an organic EL display device produced according to the invention from damage to the organic EL light emitting device or the color conversion filter due to external stress imposed on the display device. When a substance that increases viscosity by reaction curing is used for the filler material, the elasticity desirably becomes within the above-specified range after the curing or viscosity enhancement.

The filler material being disposed in the displaying area of the organic EL display must exhibit visible light transmittance in the range of about 20% to 95%, preferably about 60% to 95% for the light with wavelength of from 400 to 800 nm. Visible light transmittance in such a range permits the light from the organic EL light emitting device to efficiently transmit through the filler layer 128 to the color conversion filter. In addition, it is preferable if the filler material in the present invention has a refractive index in the range of about 1.2 to 2.5. A refractive index in such a range suppresses reflection at the boundary between filler layer 128 and organic EL light emitting device 160 and the boundary between filler layer 128 and color conversion filter 150. When a substance that increases viscosity by reaction curing is used for the filler material, the visible light transmittance and the refractive index necessarily become within the above-specified ranges after the curing or viscosity enhancement.

Examples of the filler material that are appropriately used in the present invention include UV-curable resins, thermosetting resins, fluorine-containing inactive liquid, and fluorine oil. The thermosetting resins include silicone resins that precede gelation by heating. Favorable filler materials in the present invention include the silicone resins.

Figure 2:
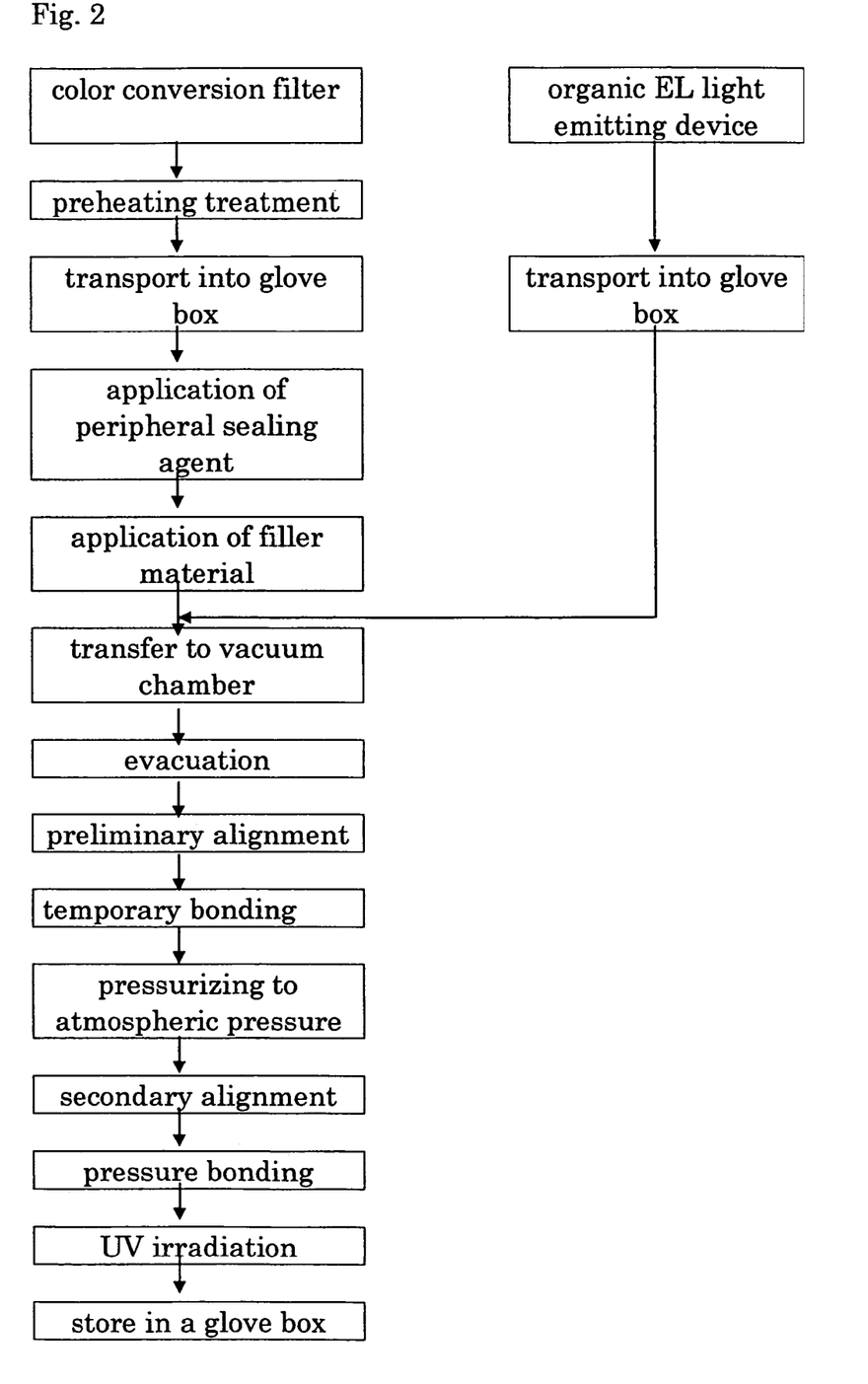
FIG. 2 shows outline processes in a method for manufacturing an organic EL display device according to the present invention.

A method according to the present invention for manufacturing an organic EL display device, in which the organic EL light emitting device and the color conversion filter are bonded together, will be described with reference to FIGS. 1 and 2. FIG. 2 is an outline of the steps in the method of the invention for manufacturing an organic EL display device.

An initial preheat treatment for the color conversion filter is done. An object of the preheat treatment is to remove water adsorbed on the surface of the color conversion filter. The preheat treatment needs to be conducted at a temperature that does not cause decomposition of color conversion dyes in the color conversion layer. The preheat temperature is lower than about 200° C., preferably in the range of about 80° C. to 180° C., more preferably in the range of about 100° C. to 150° C. By heating in a time interval between about 20 min and 60 min at a temperature in the above-specified range, the water on the surface of the color conversion filter can be removed. The preheat treatment can be conducted by employing any known appropriate means, including an oven of either a radiation type or a ventilation type. After the heating, it is preferable to immediately move the color conversion filter in an as-heated condition into an environment in which concentrations of water and oxygen are controlled. The transfer into an environment in which concentrations of water and oxygen are controlled can be executed by any appropriate means known in the art, which represents "a transfer means for a color conversion filter" according to the present invention, such as a conveyer or a manipulator.

An environment in which the concentrations of water and oxygen are controlled as referred to herein means an environment in which concentrations of water and oxygen are controlled at low values. Such an environment can be attained inside of a glove box, for example. Water concentration is controlled in such an environment in accordance with the present invention preferably to a value lower than about 50 ppm, more preferably to a value lower than about 10 ppm, and most preferably to a value not larger than about 1 ppm. Oxygen concentration also is controlled in the environment, preferably to a value lower than about 50 ppm, more preferably lower than about 10 ppm, and most preferably to a value not larger than about 1 ppm. Immediate transfer of the as-heated color conversion filter into such an environment prevents the color conversion filter surface from re-adsorption of water and prevents a peripheral sealing agent and a filler material from contamination by water or oxygen. Description of the peripheral sealing agent and the filler material will follow later.

Next, peripheral sealing agent 130' is applied to the peripheral part of the color conversion filter in a glove box. Application of the peripheral sealing agent 130' can be conducted using any appropriate means known in the art, which represents "an application means for peripheral sealing agent" in accordance with the present invention, such as a dispenser. The peripheral sealing agent 130' in the invention is applied continuously without any opening to completely enclose the display area of the color conversion filter, which is the area of the color conversion layer, that is, the display area of the organic EL display device aligning the light emitting area of the organic EL light emitting device.

Filler material 128' then is applied on the display area of the color conversion filter. The filler material can be applied by any appropriate means such as a dispenser, which represents "an application means for filler material", known in the art. An appropriate quantity of the filler material should correspond to the internal space to be filled by the filler and can be easily determined by a person skilled in the art.

FIG. 1(*b*) shows color conversion filter 150 after completion of the above-described steps. Color conversion filter 150 then is transferred into a vacuum chamber in the glove box. The transfer to the vacuum chamber can be executed by any appropriate means known in the art, such as a manipulator, which represents a part of "a first transfer means" in the present invention. Organic EL light emitting device 160, on the other hand, is transported into the environment in which the concentrations of water and oxygen are controlled, and subsequently transferred to the vacuum chamber. Organic EL light emitting device 160 can be transported into the environment in which concentrations of water and oxygen are controlled by a means, which represents "a transport means for organic EL light emitting device", similar to the means for the color conversion filter. The transfer of the organic EL light emitting device to the vacuum chamber can also be conducted by a means, which is a part of "a first transfer means" in the present invention, similar to the means for the color conversion filter.

The vacuum chamber used in the invention can be of a type in which decrease and increase of whole pressure are executed at every transfer. However, the vacuum chamber preferably is provided with a main room for manipulation and one or more subchambers that allow pressure control independently on the main room pressure to use for transfer in order to maintain the environment in the chamber to the most possible degree and to enhance throughput of manufacturing process.

Evacuation is conducted after transfer of color conversion filter 150 and organic EL light emitting device 160. Ultimate pressure is regulated by the balance between the effect of reducing content of water and oxygen remaining in the spacing between the two substrates and the evaporation rate of low molecular weight substances from the filler material and the peripheral sealing agent. The vacuum chamber is preferably evacuated down to about 1 Pa. In the case a vacuum chamber having subchamber(s) is used, color conversion filter 150 and organic EL light emitting device 160 are put into the subchamber(s) at an atmospheric pressure and then the subchamber(s) are evacuated to the pressure same as in the main chamber. After the pressure values of the subchamber(s) and the main chamber are balanced, color conversion filter 150 and organic EL light emitting device 160 are transferred to the main room, and the operations described below are conducted.

Since the peripheral sealing agent and the filler material are placed in an environment in which concentrations of water and oxygen are controlled, the adsorption of water and/or oxygen is substantially suppressed in comparison with handling in an ordinary air environment. In addition, since the peripheral sealing agent and the filler material are exposed to a vacuum in the method of the invention, water or oxygen that might be adsorbed in a trace amount is further removed. Therefore, the method of the present invention very effectively avoids adsorption and inclusion of water and oxygen to the peripheral sealing agent and the filler material in comparison with handling in an ordinary air environment.

After the evacuation, color conversion filter 150 and organic EL light emitting device 160 are bonded together simultaneously with the preliminary alignment. The bonding in this stage is a temporary bonding before curing of the peripheral sealing agent. The preliminary alignment can be performed by positioning of a means holding first substrate 102 and a means holding second substrate 116. Accuracy of the preliminary alignment is regulated by a field of vision of the optical detection element used in a secondary alignment described later. Accuracy of the preliminary alignment is favorably around 1,000 μm, more preferably around 500 μm. This accuracy of alignment can be attained with a simpler mechanism than a high precision alignment mechanism used in manufacturing liquid crystal display devices, to reduce equipment cost and thus, to reduce total production costs. After the preliminary alignment, using an apparatus for moving either color conversion filter 150 or organic EL light emitting device, which apparatus represente part of "a bonding means" according to the present invention, color conversion filter 150 and organic EL light emitting device 160 are positioned approximately parallel with each other and fixed by any appropriate means known in the art such as a clamp. At the temporary bonding stage, at least the peripheral sealing agent 130' needs to contact with first substrate 102 on the entire periphery, otherwise gas would enter the internal space in the next step of pressurization to an atmospheric pressure and bubbles would remain there.

The aggregate that is temporarily bonded and fixed with a clamp is pressurized to an atmospheric pressure in a glove box of an environment in which concentrations of water and oxygen are controlled. The whole vacuum chamber may be pressurized, or the aggregate is transferred to a subchamber of the vacuum chamber and only the subchamber is pressurized. The pressure is increased to the atmospheric pressure preferably spending 5 to 70 minutes to avoid damage to the aggregate, in particular, to the peripheral sealing agent. In the process of the pressurization, first substrate 102 and second substrate 116 are pressed in a direction perpendicular to their surfaces. Air bubbles at reduced pressure that may be present disappear, and the internal space is thoroughly filled with the filler material 128' to form filler layer 128. Since the aggregate is opened to an environment in which concentrations of water and oxygen are controlled in the method of the invention, water and oxygen are not adsorbed on the uncured peripheral sealing agent 130' in the pressurizing process. Therefore, an organic EL display device exhibiting longer life than display devices manufactured in an ordinary air environment.

After opening to atmospheric pressure, the aggregate is transferred from the vacuum chamber or the subchamber of the vacuum chamber using a manipulator or a conveyer, which represents "a second means for transfer," to a place to a work space with an environment in which concentrations of water and oxygen are controlled. The environment may be contained in a glove box. The environment in which concentrations of water and oxygen are controlled during application of the peripheral sealing agent and the environment in which concentrations of water and oxygen are controlled during secondary alignment described below may be one and the same environment, or they may be two separate environments according to the present invention.

Secondary alignment of the color conversion filter and the organic EL light emitting device is conducted in a work space in an environment in which concentrations of water and oxygen are controlled, such as in a glove box. Accuracy of the alignment is preferably accomplished with an error not larger than about 3 μm, and more preferably not larger than about 1 μm, in order to achieve high display quality. An apparatus for the secondary alignment includes an optical detection element, for example a CCD, and an apparatus for moving either or both of the first substrate and the second substrate dimensionally and relatively. The alignment is performed using alignment markers formed on the first substrate and the second substrate.

Pressed bonding is conducted using a platen, for example, and the structure of the aggregate is stabilized. Stabilization of the structure of the aggregate means to allow handling without deviation of alignment even if a fastening support tool such as a clamp is not used. Pressed bonding in the method of the invention is preferably conducted on a work stage used for the secondary alignment. In the step of pressed bonding, a pressure of about 0.5 MPa preferably is exerted corresponding to the area of the peripheral sealing agent.

Finally, the peripheral sealing agent is cured by irradiating ultraviolet radiation to form peripheral sealing layer 130. The irradiation of ultraviolet light can be conducted using a means known in the art, such as an ultraviolet lamp, which represents "a means for irradiating ultraviolet radiation" according to the present invention, depending on the type of the peripheral sealing agent used. The ultraviolet radiation is preferably irradiated, for example, with an illumination intensity of about 100 mW/cm$^2$ for about 30 seconds.

During or after the curing of the peripheral sealing agent, filler layer 128 may be treated for curing or viscosity enhancement. In the case of a filler material of thermosetting resin or silicone resin, heating may perform the curing, viscosity enhancement, or gelation. In the case of a filler material of UV-curing resin, the curing or viscosity enhancement can be performed by exposition to ultraviolet radiation together with the peripheral sealing agent.

The foregoing description references FIG. 1 which shows an active matrix driven display device that uses a TFT as a switching element. The switching element, however, can be any appropriate element such as MIM (metal-insulator-metal device) known in the art. The method of the invention can also be applied to a passive matrix-driven display device.

In the case of a passive matrix-driven display device, first electrode 108 consisting of a multiple of divided parts in a line pattern is formed on first substrate 102 without forming TFTs 104 and planarizing insulator film 106. The first electrode can be used as either an anode or a cathode in this case also. Second electrode 112 is also divided into multiple parts in a line pattern extending in a direction perpendicular to the line pattern of first electrode 108. An alignment step positions a color conversion filter layer at the position that crosses the line pattern of the first electrode and the line pattern of the second electrode.

Figure 3:
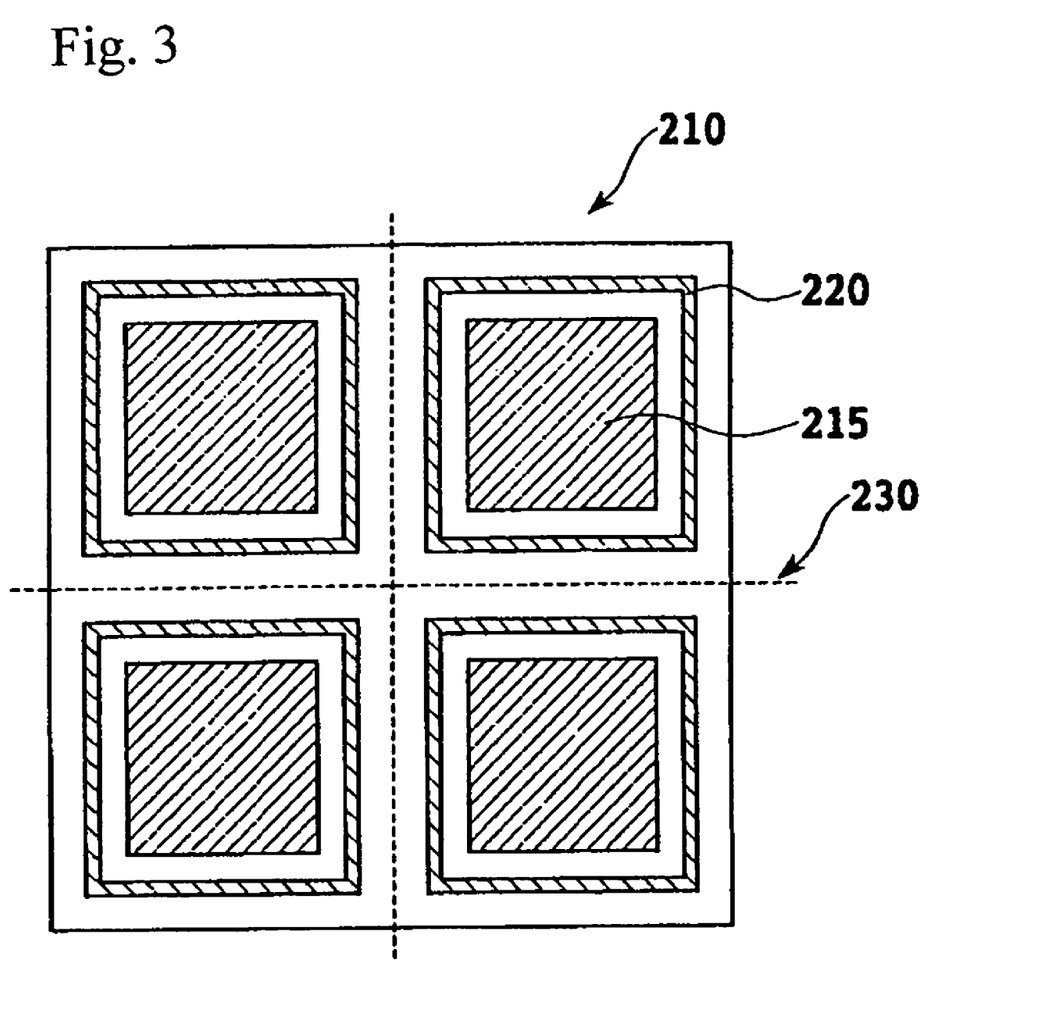
FIG. 3 illustrates a method according to the present invention for manufacturing an organic EL display device employing a color conversion filter having a plurality of display parts.

In the present invention, a color conversion filter having two or more display parts may be used, in which case an organic EL light emitting device is bonded to each display part. FIG. 3 shows color conversion filter 210 having four display parts 215. In this case, peripheral sealing agent 220 and filler material (not shown in the figure) are applied to the periphery of each display part. Subsequently, each display part is bonded to an organic EL light emitting device, aligned, and irradiated with UV radiation for curing the peripheral sealing agent. After that, the substrate is cut along cutting line 230 to obtain a multiple of organic EL display devices.

In the method described above, the peripheral sealing agent and the filler material are applied in an environment in which the concentrations of water and oxygen are controlled. Alternatively, the application step may be conducted in a vacuum chamber that is provided in an environment in which concentrations of water and oxygen are controlled. In that case, the color conversion filter that is transported after preheating treatment into a glove box environment in which concentrations of water and oxygen are controlled is immediately transferred into the vacuum chamber, in which the peripheral sealing agent and the filler material are applied using a dispenser that is installed in the vacuum chamber. The steps after the step of temporary bonding with an organic EL light emitting device that is separately carried in can be conducted in the similar manner as in the previously described method.

Figure 4:
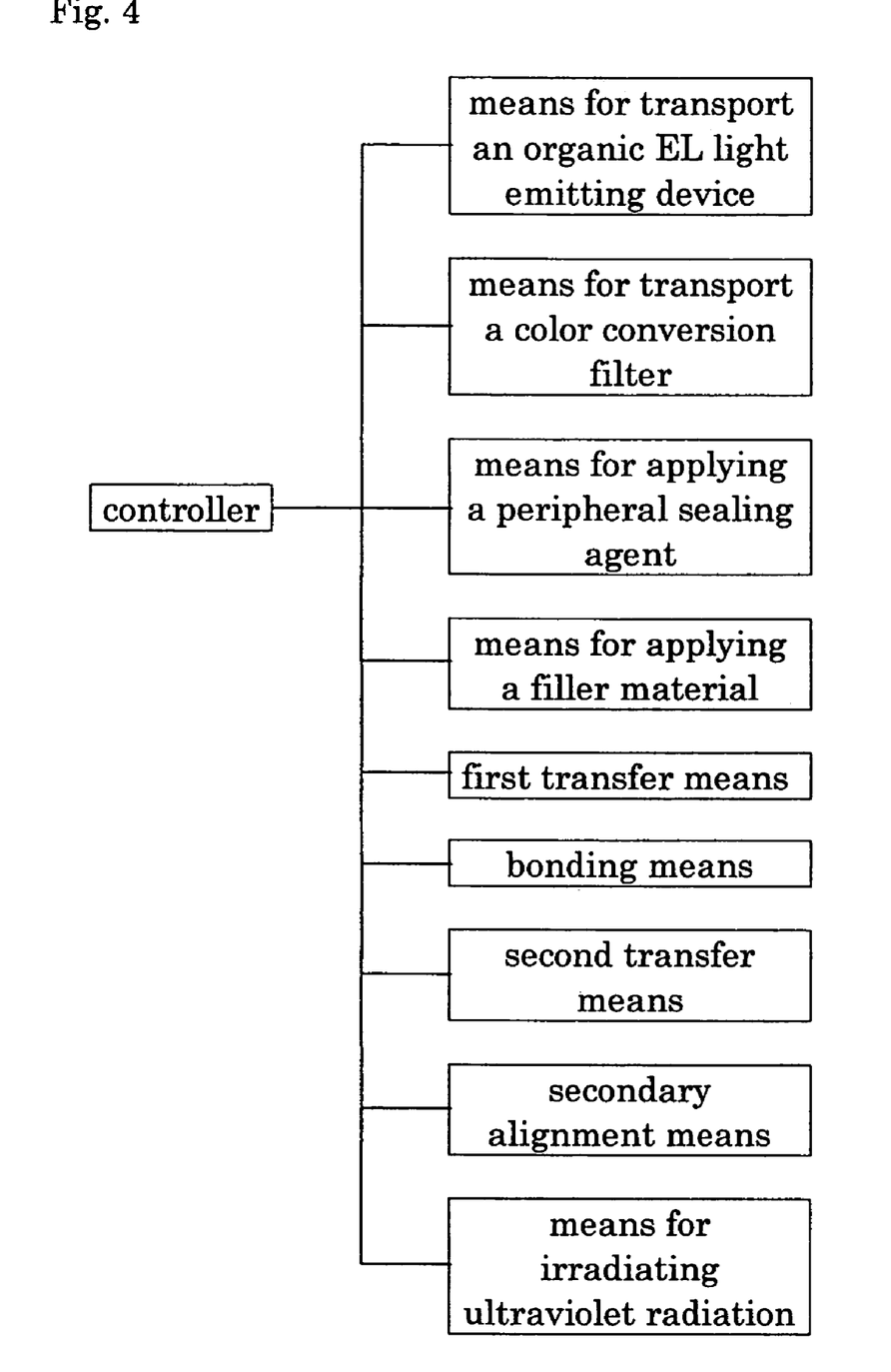
FIG. 4 shows an outline construction of an apparatus according to the present invention for manufacturing an organic EL display device.

FIG. 4 is an outline of construction of an apparatus according to the present invention for manufacturing an organic EL display device. Every means described above preferably connects to a controller. Every means in the construction of the manufacturing apparatus is controlled according to the sequence stored in the controller and to the signals put into the controller from each means.

EXAMPLE 1

A black mask 1.5 μm thick, color filter layers for red, green, and blue colors each having a thickness of 1.5 μm, and color conversion layers for red and green colors each having a thickness of 10 μm were laminated on a transparent glass substrate. By spin-coating a novolak resin-based photoresist (ZPN1100 manufactured by ZEON Corporation, Japan), covering the color conversion filter layers and the black masks, overcoat layer 124 having a thickness of 5 μm was formed employing a photolithography method, to obtain color conversion filter 150. Each color filter layer and each color conversion layer had a dimension of 85 μm×295 μm. Alignment markers were marked at four points on the substrate.

Color conversion filter 150 was then transported into a glove box in which water concentration was controlled at 1 ppm and oxygen concentration was controlled at 1 ppm. A peripheral sealing agent 130' of a ultraviolet-radiation-curing adhesive (30Y-437 manufactured by Three Bond Co., Ltd.) with dispersed spacers having a diameter of 20 μm was applied on a periphery of a second substrate 116 of the color conversion filter using a dispenser robot. Filler material 128' of transparent silicone resin (TSE3051 supplied from GE Toshiba silicone Co. Ltd.) was applied in an amount of 100% of calculated volume of internal space formed by bonded devices on the overcoat layer 124 using the dispenser robot. Since the transparent silicone resin had a surface tension of 0.04 N/m and the overcoat layer had a surface tension of 0.0250 N/m, the transparent silicone resin did not expand over the color conversion filter and took a drop form as shown in FIG. 1(b).

An organic EL light emitting device as shown in FIG. 1(a) was obtained by sequentially forming TFTs, an anode, an organic EL layer, a cathode, and a passivation layer on a glass substrate. The anode was divided into portions each having a longer side of 300 μm and a shorter side of 90 μm and arranged in a matrix form. Distance between the divided portions was determined by a pitch of 330 μm in the longer side direction and a pitch of 110 μm in the shorter side direction. Markers also were provided on organic EL light emitting device 160 corresponding to the color conversion filter. Organic EL light emitting device 160 was transported into a glove box in which water concentration was controlled to 1 ppm and oxygen concentration was controlled to 1 ppm.

Color conversion filter 150 and organic EL light emitting device 160 were transferred to a vacuum chamber, which was then evacuated to 1 Pa. Color conversion filter 150 and organic EL light emitting device 160 were temporarily bonded to form an aggregate while conducting preliminary alignment using the alignment markers. The aggregate was fastened by a clamp. Accuracy of the alignment was in an error of 500 μm.

Pressure in the vacuum chamber was increased to atmospheric pressure in 5 minutes using $N_2$ gas which was controlled to have a water concentration of 1 ppm and oxygen concentration of 1 ppm. The aggregate was transferred from the vacuum chamber to an environment which was controlled to have a water concentration of 1 ppm and oxygen concentration of 1 ppm, and secondary alignment was performed using a CCD. Accuracy of the secondary alignment was in an error of 3 μm. After the secondary alignment, the aggregate was pressure-bonded with pressure of 0.5 MPa and the clamp was removed.

Subsequently, the peripheral sealing agent was cured by irradiating ultraviolet radiation with intensity of 100 mW/cm$^2$ for 30 seconds using a UV lamp to form a peripheral sealing layer 130. Finally, heat treatment at 80° C. for 60 minutes was subjected to perform gelation of the transparent silicone resin. Thus, an organic EL display device was obtained.

EXAMPLE 2

An organic EL display device was manufactured in the same manner as in the Example 1 except that a fluorine-containing inactive liquid that does not cause reaction curing by heat (Flourinat FC-43 supplied from Sumitomo 3M Limited, Japan) was used in place of the transparent silicone resin (TSE3051 supplied from GE Toshiba Silicone Co. Ltd.) and a heat treatment at 80° C. for 60 minutes was not conducted. The fluorine-containing inactive liquid had a surface tension of 0.033 N/m.

COMPARATIVE EXAMPLE 1

An organic EL display device was manufactured in the same manner as in the Example 1 except that the operations performed in the glove box that was controlled to water concentration of 1 ppm and oxygen concentration of 1 ppm in Example 1 were conducted in an ordinary air environment.

COMPARATIVE EXAMPLE 2

An organic EL display device was manufactured in the same manner as in the Example 1 except that the preliminary alignment and the temporary bonding of the color conversion filter and the organic EL light emitting device were conducted in a glove box at atmospheric pressure in place of in a vacuum chamber.

COMPARATIVE EXAMPLE 3

An organic EL display device was manufactured in the same manner as in the Comparative Example 2 except that the operations performed in the glove box that was controlled to water concentration of 1 ppm and oxygen concentration of 1 ppm in Comparative Example 2 were conducted in an ordinary air environment in Comparative Example 3.

The organic EL display devices of Example 1 and Comparative Examples 1 through 3 were evaluated for generation of bubbles, luminance before and after a continuous 1,000 hours of operation, and occurrence of dark spots. The evaluation results are shown in Table 1. The luminance values shown are the values relative to the initial value of the organic EL display device of Example 1 taken as 100. As is apparent from Table 1, the results for the Example 1 are superior than the results for the Comparative Examples.

TABLE 1

Evaluation results of the organic EL display devices.

|  | | initial state | | after 1000 hr operation | |
| --- | --- | --- | --- | --- | --- |
|  | bubbles | luminance | dark spots | luminance | dark spots |
| Example 1 | none | 100 | none | 98 | none |
| Comp Ex 1 | none | 95 | none | 80 | medium |
| Comp Ex 2 | existing | 100 | none | 95 | none |
| Comp Ex 3 | existing | 95 | little | undetectable | great |

As demonstrated, an organic EL display device with a remarkably superior life as compared to a device manufactured by a conventional manufacturing method is obtained by the manufacturing method according to the present invention in which a peripheral sealing agent and a filler material are applied in an environment in which concentrations of water and oxygen are controlled and the color conversion filter and the organic EL light emitting device are bonded in a vacuum chamber that contains such an environment. Since the bonding process is conducted in an evacuated environment of an $N_2$ gas environment in which concentrations of water and oxygen are controlled, the quantities of the $N_2$ gas, water, and oxygen remaining in the organic EL display device are remarkably reduced. Evacuation to 1 Pa reduces each quantity to $1/10^6$ of the quantity at the atmospheric pressure. Therefore, the device life can be substantially prolonged.

In addition, since a secondary alignment with high precision is conducted under atmospheric pressure in the method of the invention, a costly and complicated apparatus for precise alignment in a vacuum chamber is not required. Therefore, cost for manufacturing equipment and total manufacturing costs are reduced.

Further, since the filler material fills the internal space in the organic EL display device, the light from the organic EL layer is efficiently transmitted to the color conversion filter layer.

All publications and patent documents cited in this application are incorporated by reference in their entirety for all purposes to the same extent as if each individual publication or patent document were so individually denoted. By their citation of various references in this document Applicants do not admit that any particular reference is "prior art" to their invention.

What is claimed is:

1. A method for manufacturing an organic EL display device comprising:

preparing an organic EL light emitting device comprising at least a first electrode, an organic EL layer, and a second electrode that are disposed over a first substrate;

preparing a color conversion filter comprising at least a color conversion filter layer that is disposed over a second substrate;

placing the organic EL light emitting device and the color conversion filter in an environment in which concentrations of water and oxygen are controlled;

applying a peripheral sealing agent with a ring shape around the color conversion filter;

applying a filler material over the color conversion filter layer and inside the peripheral sealing agent;

transferring the organic EL light emitting device and the color conversion filter into a vacuum chamber and evacuating the vacuum chamber;

carrying out a preliminary alignment of the organic EL light emitting device and the color conversion filter and bonding the organic EL light emitting device and the color conversion filter to obtain an aggregate;

taking out the aggregate to an environment in which concentrations of water and oxygen are controlled and pressure is at atmospheric pressure; and irradiating ultraviolet radiation to the aggregate for curing the peripheral sealing agent in the environment in which concentrations of water and oxygen are controlled and pressure is at atmospheric pressure to obtain an organic EL display device.

2. The method for manufacturing an organic EL display device according to claim 1, further comprising a performing a secondary alignment of the aggregate before the step of irradiating ultraviolet radiation to the aggregate.

3. The method for manufacturing an organic EL display device according to claim 1, wherein the filler material has a surface tension larger than a surface tension of a surface of the color conversion filter.

4. The method for manufacturing an organic EL display device according to claim 1, wherein the environment in which concentrations of water and oxygen are controlled and pressure is at atmospheric pressure each contain an amount of water that is not greater than 50 ppm and an amount of oxygen that is not greater than 50 ppm.

5. An apparatus for manufacturing an organic EL display device, the apparatus comprising:

a means for transporting an organic EL light emitting device comprising at least a first electrode, an organic EL layer, and a second electrode that are disposed on a first substrate into an environment in which concentrations of water and oxygen are controlled;

a means for transporting a color conversion filter comprising at least a color conversion filter layer disposed over a second substrate into the environment in which contents of water and oxygen are controlled;

a means for applying a peripheral sealing agent around the color conversion filter;

a means for applying a filler material over the color conversion filter layer and inside the peripheral sealing agent;

a first means for transferring the organic EL light emitting device and the color conversion filter into a vacuum chamber;

a bonding means for carrying out preliminary alignment of the organic EL light emitting device and the color conversion filter and bonding the organic EL light emitting device and the color conversion filter to obtain an aggregate;

a second means for transferring the aggregate from the vacuum chamber to an environment in which concentrations of water and oxygen are controlled and pressure is at atmospheric pressure; and a means for irradiating ultraviolet radiation to the aggregate for curing the peripheral sealing agent in the environment in which concentrations of water and oxygen are controlled and pressure is at atmospheric pressure.

6. The apparatus for manufacturing an organic EL display device according to claim 5, further comprising a means for performing a secondary alignment of the aggregate in the environment in which concentrations of water and oxygen are controlled and pressure is at atmospheric pressure.

* * * * *